United States Patent [19]

Arimoto

[11] Patent Number: 5,631,870
[45] Date of Patent: May 20, 1997

[54] SEMICONDUCTOR MEMORY

[75] Inventor: Kazutami Arimoto, Hyogo, Japan

[73] Assignee: Mitsubishi Denki Kabushiki Kaisha, Tokyo, Japan

[21] Appl. No.: 498,820

[22] Filed: Jul. 6, 1995

[30] Foreign Application Priority Data

Sep. 13, 1994 [JP] Japan .................................. 6-218682

[51] Int. Cl.$^6$ .................................................. G11C 11/34
[52] U.S. Cl. ............... 365/201; 365/189.01; 365/189.07; 365/189.05
[58] Field of Search .................................. 365/200, 201, 365/189.01, 189.07, 189.05

[56] References Cited

U.S. PATENT DOCUMENTS 5,400,342  3/1995  Matsumura et al. ..................... 371/21.2

FOREIGN PATENT DOCUMENTS 56-51073  5/1981  Japan .
1-118300  5/1989  Japan .
3-162800  7/1991  Japan .

OTHER PUBLICATIONS

"A 90NS 1MB DRAM With Multi-Bit Test Mode", Kumanoya et al., ISSCC85 Digest of Technical Papers, pp. 240–241.

Primary Examiner—Viet Q. Nguyen
Attorney, Agent, or Firm—Lowe, Price, LeBlanc & Becker

[57] ABSTRACT

A semiconductor memory comprising memory cells, a write buffer, a write inversion gate, a data input terminal, and four write data buses 1–4. The write buffer and the write inversion gate place onto two write data buses 1 and 3 the data input through the data input terminal. The inverted data of the input data is output onto two other write data buses 2 and 4. This causes alternately different data to be written to four contiguous memory cells. The scheme permits detection of a cell fault caused by interference between contiguous memory cells.

10 Claims, 11 Drawing Sheets

| 0 | 1 | 0 | - - - - - - - - - - - - - - - | 0 | 1 |
| 1 | 0 | 1 | - - - - - - - - - - - - - - - | 1 | 0 |
| ¦ | | | | ¦ | |
| ¦ | | | | ¦ | |
| ¦ | | | | ¦ | |
| 1 | 0 | 1 | - - - - - - - - - - - - - - - | 1 | 0 |

SEMICONDUCTOR MEMORY

BACKGROUND OF THE INVENTION

1. Field of the Invention

The present invention relates to a semiconductor memory and, more particularly, to a semiconductor memory having a test circuit for parallelly testing a plurality of memory cells.

2. Description of the Related Art

There has been proposed a test mode for testing in parallel a plurality of memory cells of a semiconductor memory in a way that shortens the time required for the test (M. Kumanoya et al., ISSCC85 Dig. of Tech. papers, pp.240-241).

FIG. 15A is a plan view showing a typical layout of a conventional dynamic random access memory (DRAM) having the above type of test mode. FIG. 15B is an enlarged plan view of the part Z in FIG. 15A.

Referring to FIGS. 15A and 15B, this DRAM comprises four memory arrays 31 located in the four corners of a memory chip, a row decoder 32 and a column decoder 33 furnished to each of the memory arrays 31, and a peripheral circuit region 34 provided in the middle of the memory chip. Each memory array 31 includes a plurality of subarrays 35 and of sense amplifier zones 36.

Each subarray 35 comprises a plurality of memory cells MC arranged in the directions of rows and columns, a word line WL furnished to correspond with each memory cell row, and a bit line pair BL, /BL provided to correspond with each memory cell column.

Each sense amplifier zone 36 includes a sense amplifier and a column selection gate CGS furnished to correspond with each column, and four signal input/output line pairs I/O1–I/O4. Each column selection gate CGS is composed of two N-channel MOS transistors.

The bit line pairs BL, /BL; sense amplifiers SA, and column selection gates CGS are arranged beforehand in groups of four each. The bit line pairs BL1, /BL1; ... ; BL4, /BL4 of each group are connected to the signal input/output line pairs I/O1–I/O4 respectively via the corresponding sense amplifiers SA1–SA4 and column selection gates CGS1–CGS4.

Each group is provided with a single column selection line CSL. When the column decoder 33 selects the column selection line CSL of a particular group, the column selection gates CGS1–CGS4 connected to that column selection line CSL conduct. This causes the bit line pairs BL1, /BL1; ... ; BL4, /BL4 of the group to be connected respectively to the signal input/output line pairs I/O1–I/O4. The column selection line CSL is furnished in common with the multiple subarrays 35 and sense amplifier zones 36.

As shown in FIG. 16, the peripheral circuit region 34 includes a data input terminal Din, a write buffer 37, four write data buses WBP1–WBP4, and a write driver 38. The write buffer 37 receives write data from the outside via the data input terminal Din, and places the received data onto the write data buses WBP1–WBP4 leading to the object of access. The write driver 38 amplifies the data over the write data buses WBP1–WBP4, and feeds the amplified data to the corresponding signal input/output line pairs I/O1–I/O4.

The peripheral circuit region 34 further comprises a preamplifier 39, four read data buses RB1–RB4, a multiplexer 40, a coincidence detection circuit (exclusive-OR gate) 41, and a data output terminal Dout. The preamplifier 39 amplifies the data over the signal input/output line pairs I/O1–I/O4, and forwards the amplified data to the corresponding read data buses RB1–RB4. The multiplexer 40 outputs, in a read operation, the data of the read data buses RB1–RB4 serially to the data output terminal Dout. The coincidence detection circuit 41, in a test mode, checks to see if the data over the read data buses RB1–RB4 coincide with one another. In case of coincidence, the coincidence detection circuit 41 outputs to the data output terminal Dout a high-level pass flag indicating that the memory cells MC under test are normal.

Below is a description of how the DRAM outlined above with reference to FIGS. 15A, 15B and 16 works. In a normal write operation, data is input serially through the data input terminal Din. The input data is transferred by the write buffer 37 to the write data buses WBP1–WBP4 leading to the object of access. The transferred data is amplified by the write driver 38 before being input to the corresponding signal input/output line pairs I/O1–I/O4. The data over the signal input/output line pairs I/O1–I/O4 is fed to the four bit line pairs BL1, /BL1; ... ; BL4, /BL4 of the group selected by the column decoder 33. From there, the data is written simultaneously to the four memory cells MC connected to the word line WL selected by the row decoder 30.

In a normal read operation, the multiplexer 40 is activated and the coincidence detection circuit 41 inactivated. The relevant bit line pairs BL, /BL are fed with the data read from the memory cells MC connected to the word line WL selected by the row decoder 32. The signal input/output line pairs I/O1–I/O4 are then supplied with the data from the four bit line pairs BL1, /BL1; ... ; BL4, /BL4 of the group selected by the column decoder 33. The preamplifier 39 amplifies the data over the signal input/output line pairs I/O1–I/O4 and forwards the amplified data to the corresponding read data buses RB1–RB4. From there, the data is output serially by the multiplexer 40 to the data output terminal Dout.

In a write operation where the test mode is in effect, a data item entered through the data input terminal Din is transferred by the write buffer 37 onto four write data buses WBP1–WBP4. Thereafter, the data is written to four memory cells MC under test as in the case of the normal write operation. That is, in the test mode, the same data is written simultaneously to four memory cells MC.

The writing of data to the four memory cells MC is followed by the input, via the data input terminal Din, illustratively of the data item complementary to the previously entered data. The adjacent word line WL is then selected and the same write operation is carried out. It follows that, as shown in FIG. 17, data is written inverted to every four memory cells MC of the same row and to every memory cell MC of the same column.

In a read operation where the test mode is in effect, the multiplexer 40 is inactivated and the coincidence detection circuit 41 activated. The relevant bit line pairs BL, /BL are fed with the data read from the memory cells MC connected to the word line WL selected by the row decoder 32. The signal input/output line pairs I/O1–I/O4 are then supplied with the data from the four bit line pairs BL1, /BL1; ... ; BL4, /BL4 of the group selected by the column decoder 33. The preamplifier 39 amplifies the data over the signal input/output line pairs I/O1–I/O4 and forwards the amplified data to the corresponding read data buses RB1–RB4. Upon detecting coincidence between the data on the read data buses RB1–RB4, the coincidence detection circuit 41 outputs a high-level pass flag indicating that the four memory cells MC under test are normal. In case of a mismatch between the data on the read data buses RB1–RB4, the coincidence detection circuit 41 outputs a low-level fail flag indicating that at least one of the four memory cells MC in question is defective. After this, the adjacent word line WL is illustratively selected and the same read operation is repeated.

In the test mode, this DRAM allows its memory cells MC to be tested four at a time in parallel. This means that the above-described DRAM can be tested four times as fast as DRAM's wherein the memory cells MC are tested one by one. This scheme results in appreciable savings in testing time and in the cost required of the tests.

However, the above conventional scheme has the following disadvantage: in the above test mode, the same data item is written to every four memory cells MC (e.g., those indicated by solid circles in FIG. 15B). As a result, where different data items are written to two contiguous memory cells MC, the conventional setup has a reduced capability of detecting a faulty memory caused by the interference between the memory cells.

SUMMARY OF THE INVENTION

It is therefore an object of the present invention to provide a semiconductor memory having a test mode which requires a reduced test time and permits a high capability of getting faulty memory cells detected.

Briefly stated, in the semiconductor memory device in accordance with a first aspect of the present invention, two memory cells are selected in a test mode, and first and second signals are written parallel to the selected two memory cells such that one of the two memory cells stores the first signal and the other stores the second. Therefore, according to the present invention, capability of detecting defect caused by interference of adjacent memory cells can be improved and the time necessary for testing can be reduced.

Preferably, writing circuit includes a first signal generating circuit for outputting an externally applied signal and an inverted signal thereof, and a first selecting circuit for selectively applying the signal or the inverted signal. Therefore, the first or the second signal can be easily applied to each of the two memory cells.

Preferably, the test circuit includes a signal processing circuit for outputting a signal read from a memory cell to which a first signal is written, and an inverted signal of the signal read from a memory cell to which the second signal is written, and a logic circuit for outputting a signal indicating that the two memory cells are normal, in response to coincidence of logics of the two signals output from the signal processing circuit. Therefore, whether the two memory cells are normal or defective can be readily determined based on the signals read from the two memory cells.

More preferably, the signal processing circuit includes a second signal generating circuit for outputting the signal read from the corresponding memory cell and an inverted signal thereof, and a second selecting circuit for selectively applying either the signal or the inverted signal to the logic circuit. Thus, the signal processing circuit can be readily configured.

More preferably, address terminals are provided corresponding to each of the two memory cells, and the first and the second selecting circuits select the signal or the inverted signal based on the first or second potential applied to the corresponding address terminal. Therefore, the first and the second selecting circuits can be easily controlled.

Briefly stated, in the semiconductor memory device in accordance with a second aspect of the present invention, in a test mode, a plurality of contiguously arranged memory cells are selected, and first and second signals are written parallel to each of the plurality of memory cells such that one of two contiguous memory cells stores the first signal and the other stores the second. Therefore, according to the present invention, capability of detecting defect caused by interference between adjacent memory cells can be improved, and the time necessary for testing can be reduced.

Preferably, a writing circuit includes a first signal generating circuit for outputting an externally applied signal and an inverted signal thereof, and a first selecting circuit for selectively applying the signal or the inverted signal to a corresponding memory cell. Therefore, the first or the second signal can be easily applied to each of the contiguous two memory cells.

Further, preferably, a test circuit includes a signal processing circuit for outputting a signal read from a memory cell to which the first signal is written and an inverted signal of the signal read from a memory cell to which the second signal is written, and a logic circuit for outputting a signal indicating whether the plurality of memory cells are normal, in response to coincidence of logics of the plurality of signals output from the signal processing circuit. Therefore, whether the plurality of memory cells are normal or defective can be readily determined based on the signals read from the plurality of memory cells.

More preferably, the signal processing circuit includes a second signal generating circuit for outputting a signal read from a corresponding memory cell and an inverted signal thereof, and a second selecting circuit for selectively applying the signal or the inverted signal to the logic circuit. Thus, the signal processing circuit can be easily configured.

Further, more preferably, address terminals are provided corresponding to each of the plurality of memory cells, and the first and the second selecting circuits select the signal or the inverted signal in accordance with a first or a second potential applied to the corresponding address terminal. Therefore, the first and the second selecting circuits can be controlled easily.

Briefly stated, in the semiconductor memory device in accordance with a third aspect of the present invention, an address signal converting circuit for converting a first address signal designating a plurality of contiguously arranged memory cell into a second address signal designating a plurality of mutually apart memory cells. Therefore, according to the present invention, a plurality of memory cells apart from each other can be tested in parallel, and therefore capability of detecting defects caused by interference between adjacent memory cells can be improved, and the time necessary for testing can be reduced.

Preferably, the second address signal designates a plurality of memory cells belonging to mutually different memory arrays. Therefore, whether or not a memory array or the like is normal or not can be tested, in addition to the memory cells.

Preferably, the second address signal designates a plurality of memory cells selected by mutually different column selecting lines. Therefore, whether or not the column selecting line or the like is normal can also be tested.

Preferably, the address signal converting means includes a switch for differently combining a plurality of signals constituting the first address signal to generate a second address signal. Therefore, the address signal converting circuit can be easily configured.

The foregoing and other objects, features, aspects and advantages of the present invention will become more

DESCRIPTION OF THE PREFERRED EMBODIMENTS

First Embodiment

Figure 1:
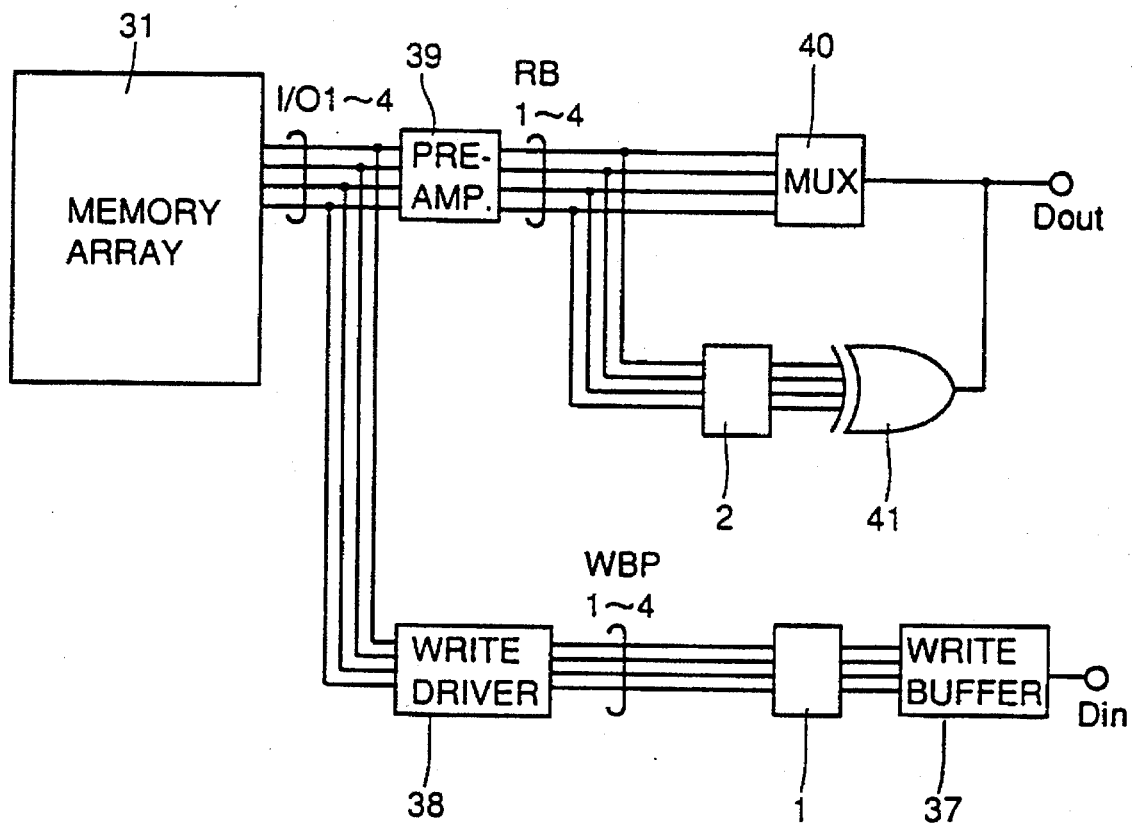
FIG. 1 is a circuit block diagram showing principal component parts of a DRAM practiced as a first embodiment of the invention.

FIG. 1 is a circuit block diagram showing principal component parts of a DRAM practiced as the first embodiment of the invention.

Figure 15A:
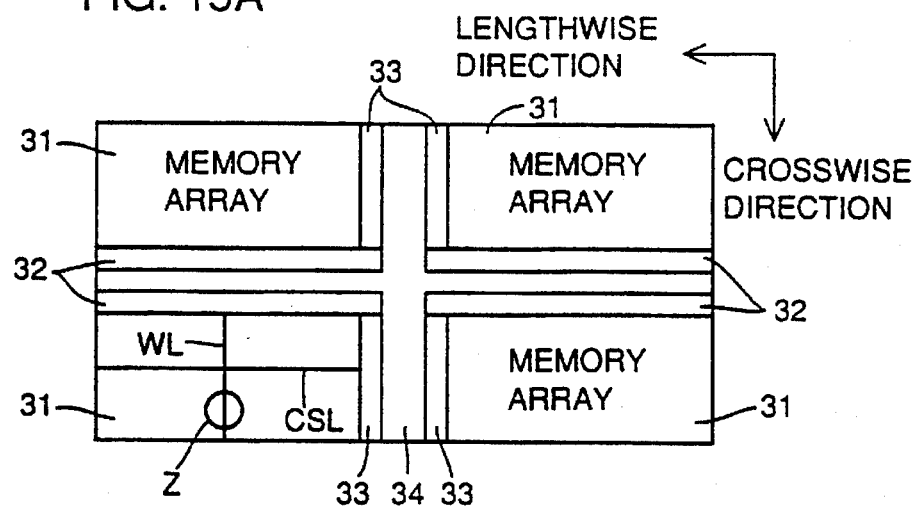
FIGS. 15A and 15B are plan views portraying the chip layout of the conventional DRAM.
Figure 15B:
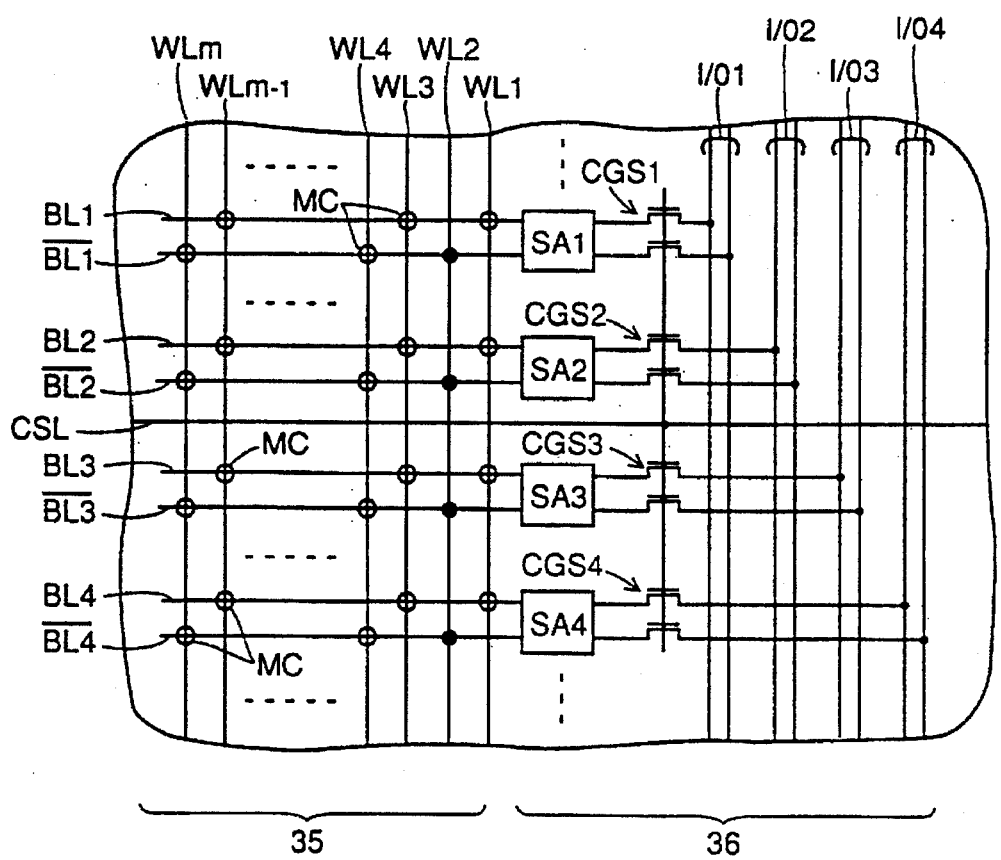
Figures 16, 17:
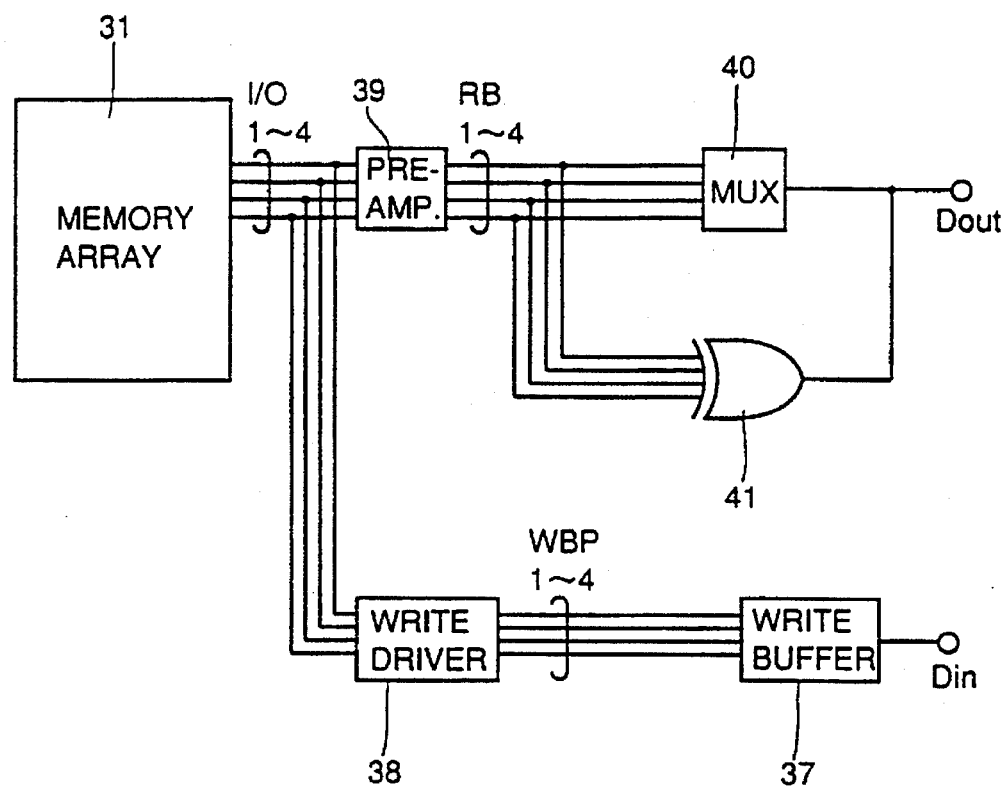
FIG. 16 is a circuit block diagram depicting a typical structure of the peripheral circuit region in the DRAM of FIG. 15.
FIG. 17 is a view illustrating a checkerboard pattern of the DRAM in FIG. 15 in effect when the DRAM is in a test mode.

Referring to FIG. 1, what makes this DRAM different from the conventional DRAM of FIGS. 15 and 16 is the presence of two additional component parts: a write inversion gate 1 furnished downstream of the write buffer 37, and a read inversion gate 2 installed upstream of the coincidence detection circuit 2. The chip layout of the first embodiment is the same as that of the conventional DRAM and will not be discussed further.

Figure 2:
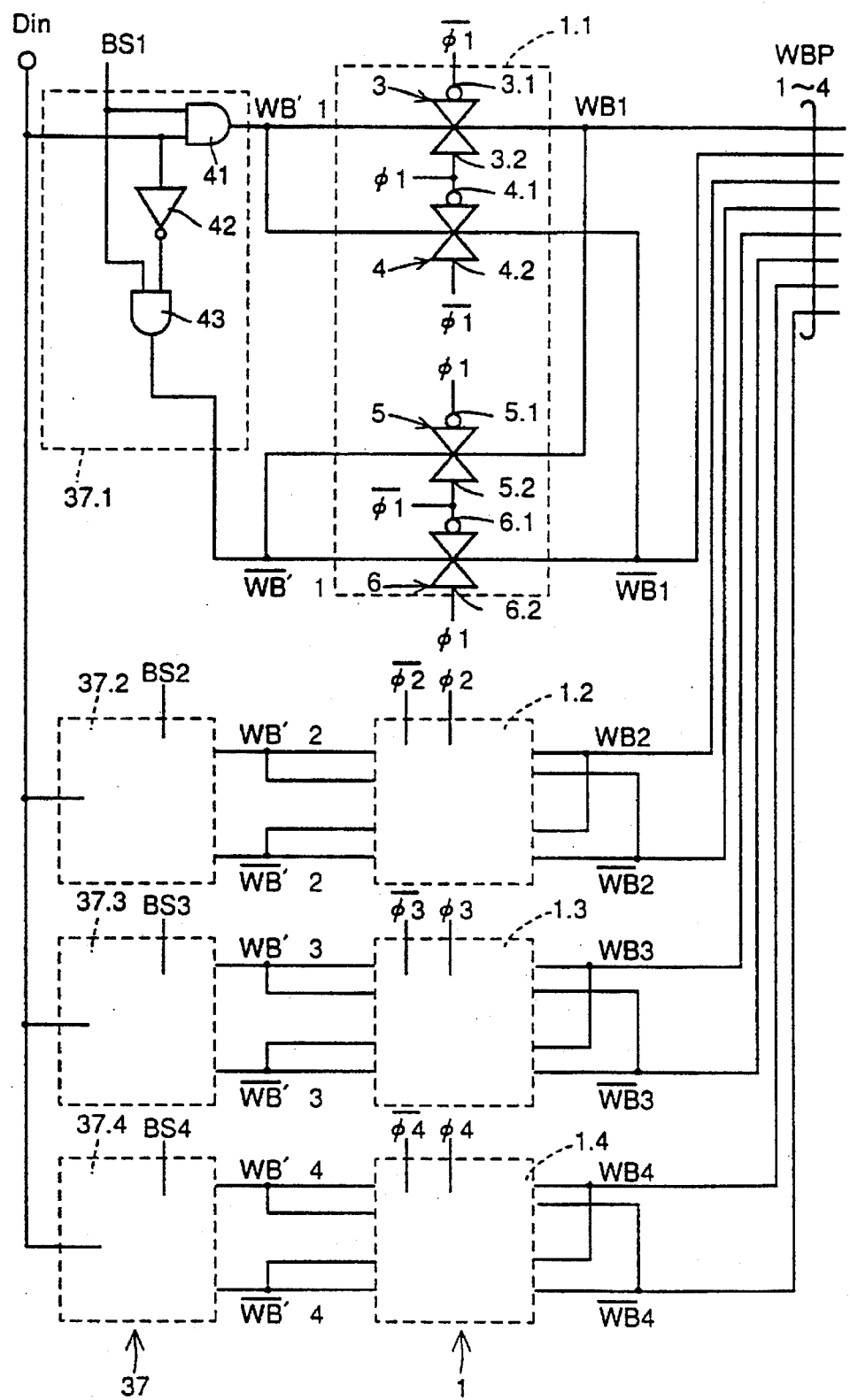
FIG. 2 is a partially omitted circuit block diagram depicting typical structures of a write buffer and a write inversion gate in the DRAM of FIG. 1.

FIG. 2 is a partially omitted circuit block diagram depicting typical structures of the write buffer 37 and the write inversion gate 1 in the DRAM of FIG. 1.

The write buffer 37 includes four signal generation circuits 37.1–37.4 furnished to correspond respectively with write data buses WBP1–WBP4. The signal generation circuits 37.1–37.4 receive write buffer activation signals BS1–BS4, respectively.

The signal generation circuit 37.1 comprises AND gates 41 and 43 and an inverter 42. A data input terminal Din is connected directly to one input terminal of the AND gate 41, as well as to one input terminal of the AND gate 43 via the inverter 42. The write buffer activation signal BS1 is input to the other input terminal of the AND gate 41 and to that of the AND gate 43. The output terminals of the AND gates 41 and 43 are connected respectively to write data bus lines WB'1 and /WB'1 provided upstream.

When the corresponding write buffer activation signal BS1 is driven High, the signal generation circuit 37.1 gets the data of the data input terminal Din output unmodified onto the write data bus line WB'1 on the one hand, and inverted onto the write data bus line /WB'1 on the other hand. The same workings apply to the other signal generation circuits 37.2–37.4.

The write inversion gate 1 includes four signal selection circuits 1.1–1.4 furnished to correspond respectively with the write data buses WBP1–WBP4. The signal selection circuits 1.1–1.4 receive switching signals $\phi1$, /$\phi1$; ...; $\phi4$, /$\phi4$, respectively.

Figure 3A:
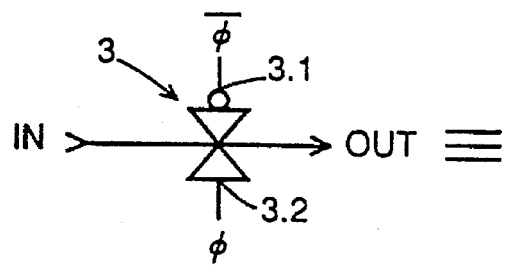
FIGS. 3A and 3B are circuit diagrams illustrating a typical structure of a transfer gate in the write inversion gate of FIG. 2.
Figure 3B:
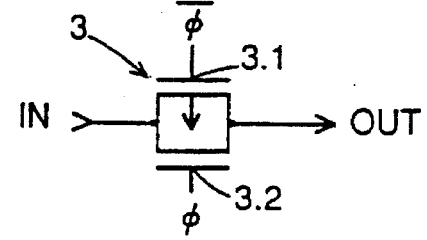

The signal selection circuit 1.1 comprises four transfer gates 3–6. As shown in FIGS. 3A and 3B, the transfer gate 3 is constituted by the conductive electrode of a P-channel MOS transistor connected with the conductive electrode of an N-channel MOS transistor. That is, the transfer gate 3 includes the gate electrode 3.1 of the P-channel MOS transistor and the gate electrode 3.2 of the N-channel MOS transistor. The same constitution applies to the other transfer gates 4–6.

The transfer gate 3 is connected interposingly between the write data bus line WB'1 on the upstream side and the write data bus line WB1 on the downstream side. The transfer gate 4 is connected interposingly between the write data bus line WB'1 on the upstream side and the data bus line /WB1 on the downstream side. The transfer gate 5 is connected interposingly between the write data bus line /WB'1 on the upstream side and the write data bus line WB1 on the downstream side. The transfer gate 6 is connected interposingly between the write data bus line /WB'1 on the upstream side and the write data bus line /WB1 on the downstream side.

The switching signal $\phi1$ is received by the gate electrodes 3.2 and 6.2 of the N-channel MOS transistors in the transfer gates 3 and 6, and by the gate electrodes 4.1 and 5.1 of the P-channel MOS transistors in the transfer gates 4 and 5. The switching signal /$\phi1$ is received by the gate electrodes 3.1 and 6.1 of the P-channel MOS transistors in the transfer gates 3 and 6, and by the gate electrodes 4.2 and 5.2 of the N-channel MOS transistors in the transfer gates 4 and 5.

When the switching signal $\phi1$ is driven High and the switching signal /$\phi1$ Low, the transfer gates 3 and 6 conduct while the transfer gates 4 and 5 are shut down. This allows the data of the upstream write data bus lines WB'1 and /WB'1 to be input unmodified onto the downstream write data bus lines WB1 and /WB1.

Conversely, when the switching signal $\phi1$ is brought Low and the switching signal /$\phi1$ High, the transfer gates 3 and 6 are shut down while the transfer gates 4 and 5 conduct.

This causes the data of the upstream write data bus lines WB'1 and /WB'1 to be placed inverted onto the downstream write data bus lines /WB1 and WB1. The same workings apply to the other signal selection circuits 1.2–1.4.

Figure 4:
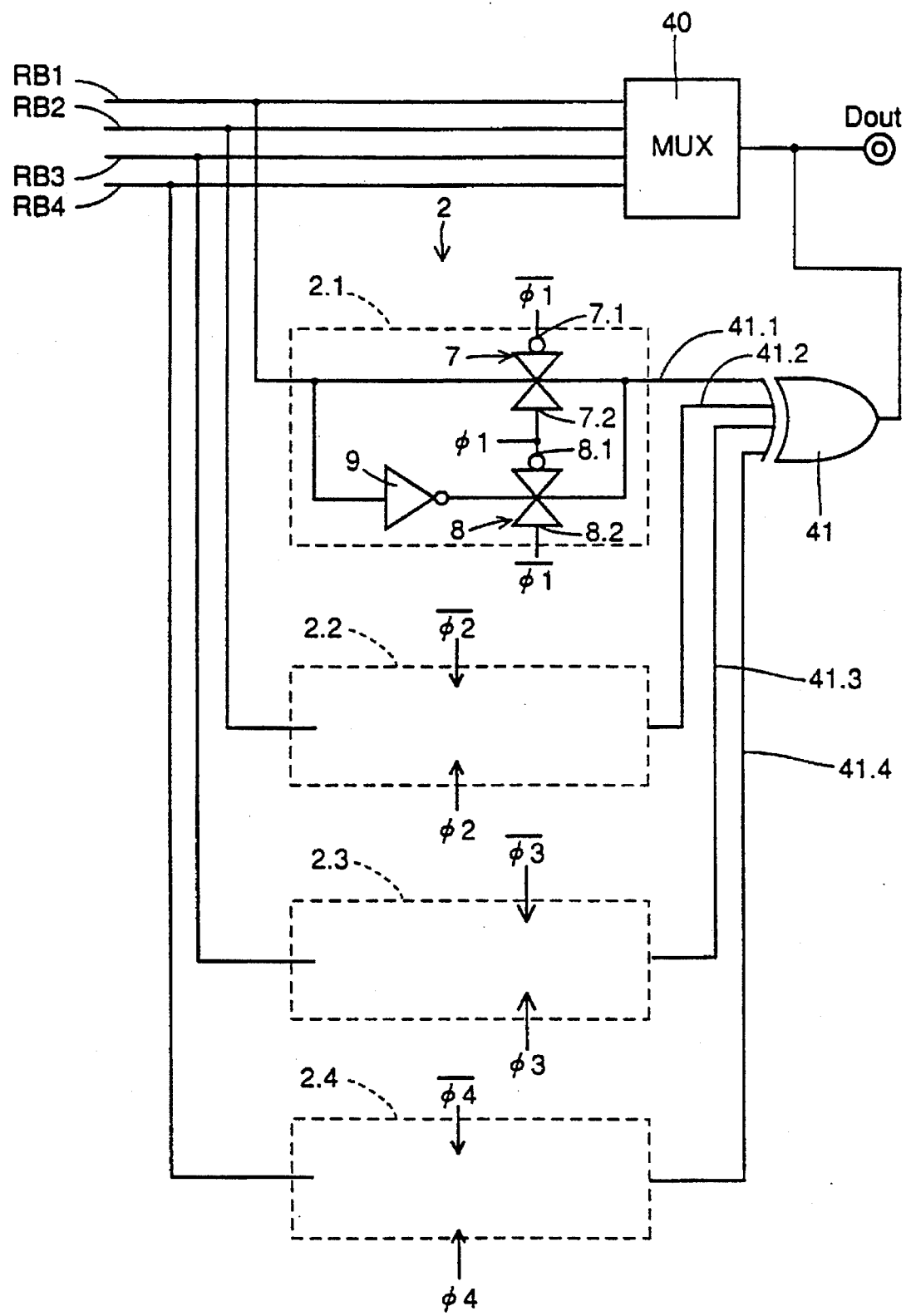
FIG. 4 is a partially omitted circuit block diagram indicating a typical structure of a read inversion gate in the DRAM of FIG. 1.

FIG. 4 is a partially omitted circuit block diagram indicating a typical structure of the read inversion gate 2 in the DRAM of FIG. 1.

The read inversion gate 2 includes four signal processing circuits 2.1–2.4 installed interposingly between read data buses RB1–RB4 on the one hand, and the input terminals 41.1–41.4 of a coincidence detection circuit 41 on the other hand. The signal processing circuits 2.1–2.4 receive switching signals $\phi 1$, /$\phi 1$; . . . ; $\phi 4$, /$\phi 4$, respectively.

The signal selection circuit 2.1 comprises transfer gates 7 and 8 and an inverter 9. The transfer gate 7 is connected interposingly between the read data bus RB1 and the input terminal 41.1 of the coincidence detection circuit 41. The inverter 9 and transfer gate 8 are connected in a serially interposing manner between the read data bus RB1 and the input terminal 41.1 of the coincidence detection circuit 41. The switching signal $\phi 1$ is received by the gate electrode 7.2 of the N-channel MOS transistor in the transfer gate 7, and by the gate electrode 8.1 of the P-channel MOS transistor in the transfer gate 8. The switching signal /$\phi 1$ is received by the gate electrode 7.1 of the P-channel MOS transistor in the transfer gate 7, and by the gate electrode 8.2 of the N-channel MOS transistor in the transfer gate 8.

When the switching signal $\phi 1$ is driven High and the switching signal /$\phi 1$ Low, the transfer gate 7 conducts and the transfer gate 8 is shut down. This causes the data of the read data bus RB1 to be input unmodified to the input terminal 41.1 of the coincidence detection circuit 41.

Conversely, when the switching signal $\phi 1$ is brought Low and the switching signal /$\phi 1$ High, the transfer gate 7 is shut down and the transfer gate 8 conducts. This causes the data of the read data bus RB1 to be input inverted to the input terminal 41.1 of the coincidence detection circuit 41. The same workings apply to the other signal processing circuits 2.2–2.4.

Figure 5:
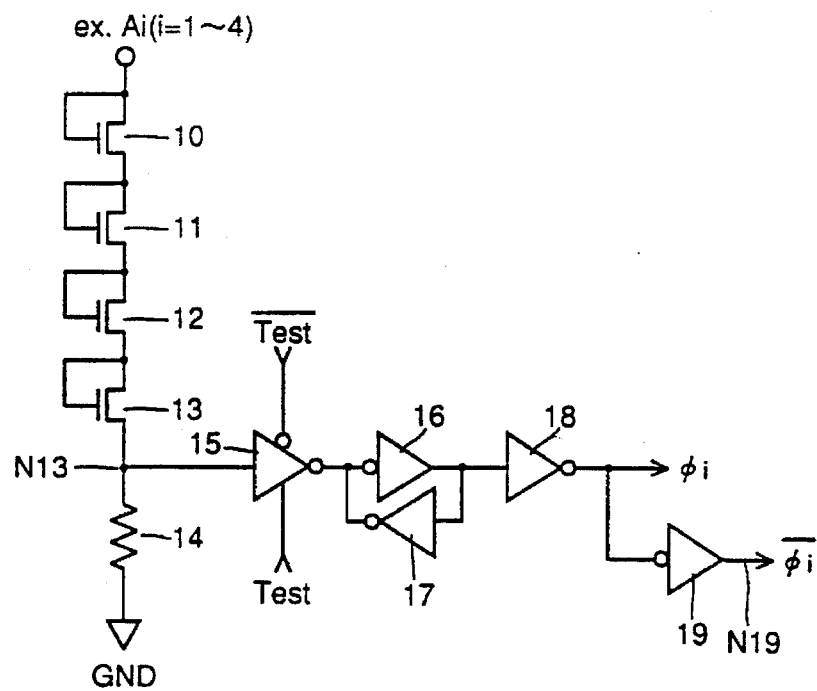
FIG. 5 is a circuit block diagram representing a typical structure of a switching signal generation circuit in the DRAM of FIG. 1.
Figure 6:
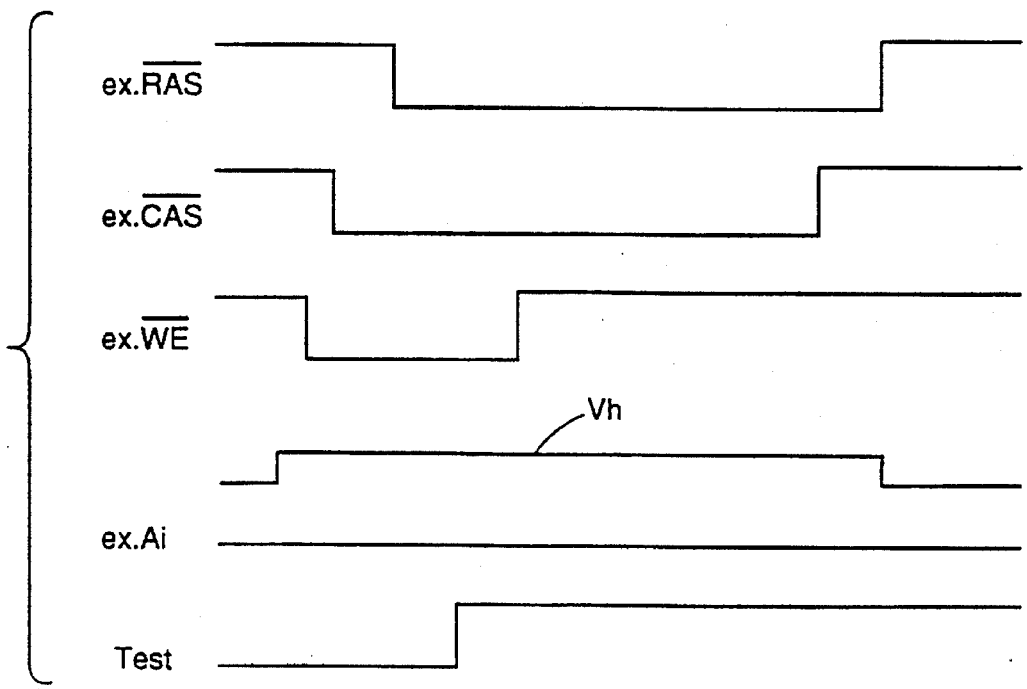
FIG. 6 is a timing chart for explaining how the switching signal generation circuit of FIG. 5 works.

FIG. 5 is a circuit block diagram illustrating a typical structure of a switching signal generation circuit for generating the switching signals $\phi 1$ and /$\phi 1$. FIG. 6 is a timing chart for explaining how the switching signal generation circuit of FIG. 5 works.

Referring to FIG. 5, the switching signal generation circuit comprises a plurality of (in this example, 4) N-channel MOS transistors 10–13 connected in series between an appropriate address pin ex.A1 and a node N13. The N-channel MOS transistors 10–13 constitute a diode connection. The node N13 is connected to ground via a resistor 14.

The switching signal generation circuit further includes a three-state buffer 15 and three inverters 16, 18 and 19 connected in a serially interposing manner between the node N13 and a node N19. Also included in the switching signal generation circuit is an inverter 17 connected to the inverter 16 in a parallelly reversed manner. The three-state buffer 15 is controlled by use of test mode enable signals Test and /Test. The inverters 16 and 17 make up a latch circuit. The inverters 18 and 19 output the switching signals $\phi 1$ and /$\phi 1$, respectively.

What follows is a description of how the switching signal generation circuit of FIG. 5 operates. The test mode enable signal Test is driven High upon acknowledgement of the timing of WCBR (Write and CAS Before RAS) wherein the signals ex./WE and ex.CAS fall earlier than the signal ex./RAS.

In this state, the address pin ex.A1 is fed with a high voltage level Vh that is several volts higher than the power supply level Vcc. This causes the N-channel MOS transistors 10–13 to conduct, connecting the node N13 with the address pin ex.A1 and driving the node N13 High. The level of the node N13 is inverted by the three-state buffer 15 and by the three inverters 16, 18 and 19. This brings the switching signal $\phi 1$ Low and the switching signal /$\phi 1$ High.

When application of the high voltage level Vh to the address pin ex.A1 is halted, the N-channel MOS transistors 10–13 are shut down. This connects the node N13 to ground via the resistor 14 and drives the node N13 Low. As a result, the switching signal $\phi 1$ goes High and the switching signal /$\phi 1$ Low. The other switching signals $\phi 2$, /$\phi 2$; . . . ; $\phi 4$, /$\phi 4$ are also generated by circuits of the same constitution.

Described below is how the DRAM discussed with reference to FIGS. 1 through 6 works. In normal write and read operations, the address pins ex.A1–ex.A4 of the respective switching signal generation circuits are not supplied with the high voltage level Vh. The switching signals $\phi 1$ through $\phi 4$ are driven High, and the switching signals /$\phi 1$ through /$\phi 4$ are brought Low.

In such a case, no inversion is carried out by the write inversion gate 1. That is, the data of the write data buses WB'1, /WB'1; . . . ; WB'4, /WB'4 on the upstream side are placed unmodified onto the write data buses WB1, /WB1; . . . ; WB4, /WB4 on the downstream side, respectively. Furthermore, no inversion is performed by the read inversion gate 2; the data of the read data buses RB1–RB4 are input unmodified to the coincidence detection circuit 41. Thus in normal write and read operations, the DRAM of FIGS. 1 through 6 works in the same manner as the conventional DRAM of FIGS. 15A. 15B and 16.

In the case of write and read operations in the test mode, the address pins ex.A1 and ex.A3, or ex.A2 and ex.A4 are fed with the high voltage level Vh. For example, suppose that the address pins ex.A2 and ex.A4 are supplied with the high voltage level Vh. In that case, the switching signals $\phi 2$ and $\phi 4$ are driven High and the switching signals /$\phi 2$ and /$\phi 4$ are brought Low.

In the case above, inversion is carried out by the signal selection circuits 1.2 and 1.4 of the write inversion gate 1. That is, the data of the write data buses WB'2, /WB'2 and WB'4, /WB'4 on the upstream side are placed inverted onto the write data buses WB2, /WB2 and WB4, /WB4 on the downstream side. Furthermore, inversion is effected by the signal processing circuits 2.2 and 2.4 of the read inversion gate 2. This causes the data of the read data buses RB2 and RB4 to be input inverted to the coincidence detection circuit 41.

In the case of a write operation in the test mode, the write buffer activation signals BS1–BS4 are all driven High. This causes the data of the data input terminal Din to be input unmodified to the write data bus lines WB'1–WB'4 on the one hand, and placed inverted onto the write data bus lines /WB'1–/WB'4 on the other hand. The switching signals $\phi 1$ and $\phi 3$ are driven High and the switching signals /$\phi 1$ and /$\phi 3$ Low, whereas the switching signals $\phi 2$ and $\phi 4$ are brought Low and the switching signals /$\phi 2$ and /$\phi 4$ High. This causes the data of the data input terminal Din to be input unmodified to the write data bus lines WB1, /WB2, WB3 and /WB4 on the one hand, and placed inverted onto the write data bus lines /WB1, WB2, /WB3 and WB4 on the other hand.

Figures 7, 8:
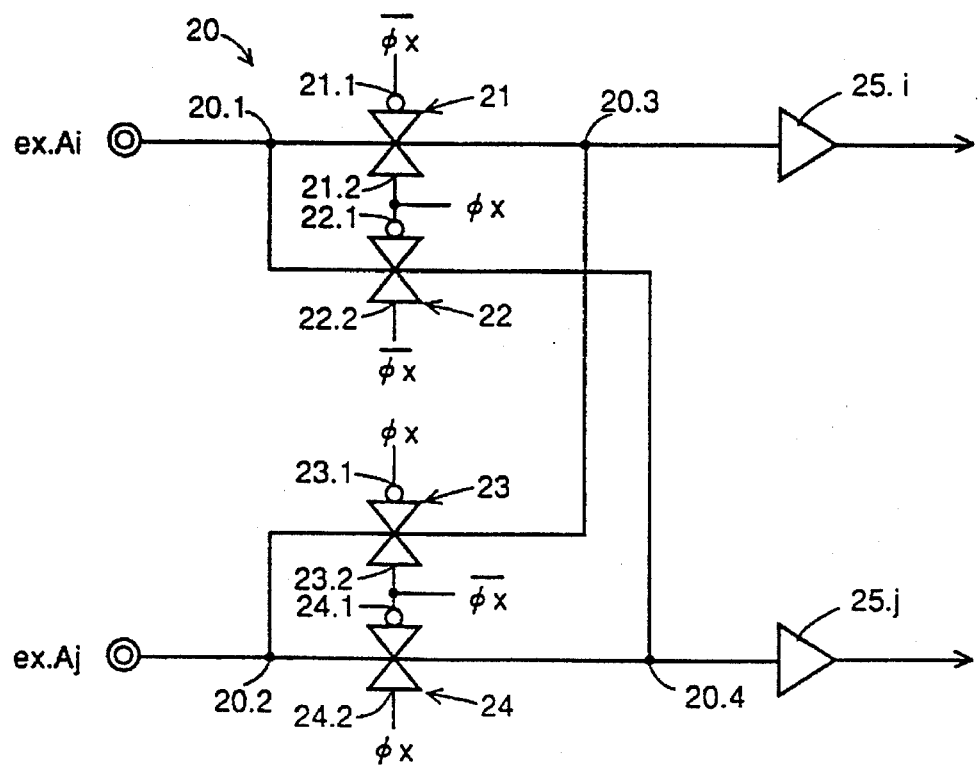
FIG. 7 is a view showing a checkerboard pattern of the DRAM in FIG. 1 in effect when the DRAM is in a test mode.
FIG. 8 is a circuit block diagram sketching principal component parts of a DRAM practiced as a second embodiment of the invention.

Thereafter, data is written to the four memory cells MC under test in the same manner as with the conventional DRAM of FIGS. 15A, 15B and 16. That is, in the test mode, alternately different data items are first written to the four memory cells MC. Then the data complementary to the preceding data is input to the data input terminal Din. Illustratively, the adjacent word line WL is selected and the same write operation is repeated. This allows alternately different data items to be written to the contiguous memory cells MC, as shown in FIG. 7.

In the case of a read operation in the test mode, the write buffer activation signals BS1-BS4 are all fixed to the low level, and the write buffer 37 is inactivated. The multiplexer 40 is inactivated, while the coincidence detection circuit 41 is activated.

The data items read from the four memory cells MC under test and placed onto signal input/output line pairs I/O1-I/O4 are amplified by the preamplifier 39. The amplified data items are output onto the read data buses RB1-RB4. The read inversion gate 2 lets the data of the read data buses RB1 and RB3 be input unmodified to the coincidence detection circuit 41 and causes the data of the read data buses RB2 and RB4 to be input inverted to the coincidence detection circuit 41.

In case of a coincidence detected between the data of the four input terminals 41.1-41.4, the coincidence detection circuit 41 outputs to the data output terminal Dout a high-level pass flag indicating that the memory cells MC under test are normal. In case of a mismatch between the data of the four input terminals 41.1-41.4, the coincidence detection circuit 41 outputs to the data output terminal Dout a low-level fail flag indicating that at least one of the memory cells MC under test is defective. Thereafter, the adjacent word line WL is illustratively selected and the same read operation is repeated.

The above-described first embodiment in the test mode is capable of writing alternately different data items to the contiguous memory cells MC. This makes it possible to test for a cell failure caused by interference between any two contiguous memory cells MC.

Second Embodiment

FIG. 8 is a circuit block diagram sketching principal component parts of a DRAM practiced as the second embodiment of the invention.

Referring to FIG. 8, what makes this DRAM different from the conventional DRAM is the presence of an additional changeover switch 20 interposed between external address pins ex.Ai and ex.Aj on the one hand, and address buffers 25.i and 25.j on the other hand. The changeover switch 20 acts to recombine externally supplied address signals.

The changeover switch 20 comprises two input terminals 20.1 and 20.2, two output terminals 20.3 and 20.4, and four transfer gates 21-24. The transfer gate 21 is connected interposingly between the terminals 20.1 and 20.3; the transfer gate 22, between the terminals 20.1 and 20.4; the transfer gate 23, between the terminals 20.2 and 20.3; the gate 24, between the terminals 20.2 and 20.4. The gate electrodes 21.2, 22.1, 23.1 and 24.2 of the transfer gates 21-24 all receive a switching signal $\phi x$. The gate electrodes 21.1, 22.2, 23.2 and 24.1 of the transfer gates 21-24 all receive a switching signal $/\phi x$. The switching signals $\phi x$ and $/\phi x$ are generated by a circuit similar to the changeover signal generation circuit of FIG. 5.

The input terminals 20.1 and 20.2 of the changeover switch 20 are connected to the external address pins ex.Ai and ex.Aj, respectively. The output terminals 20.3 and 20.4 of the changeover switch 20 are connected to the input terminals of the address buffers 25.i and 25.j, respectively.

How the DRAM of FIG. 8 works will now be described. Whether this DRAM is in normal operation or in the test mode, the external address pins ex.Ai and ex.Aj are supplied with external address signals designating four contiguous memory cells MC shown in FIG. 15.

Figure 9A:
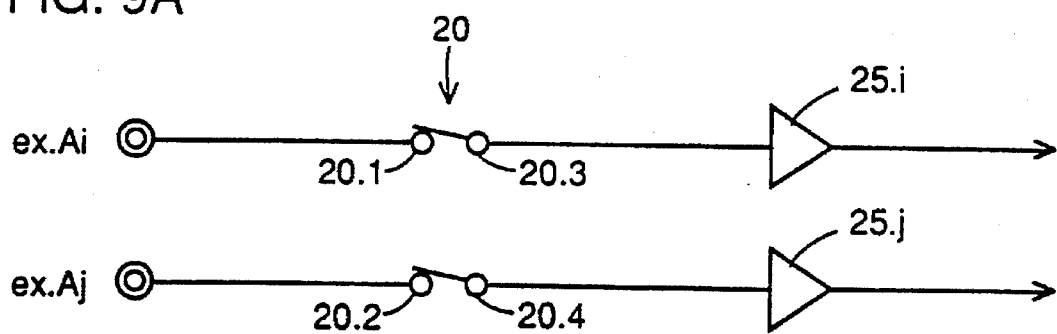
FIGS. 9A and 9B are circuit block diagrams for explaining how the DRAM of FIG. 8 works.

In normal operation, the switching signal $\phi x$ is driven High and the switching signal $/\phi x$ Low. In turn, the transfer gates 21 and 24 conduct and the transfer gates 22 and 23 are shut down. This connects the terminals 20.1 and 20.2 with the terminals 20.3 and 20.4, respectively, as indicated in FIG. 9A. Thus the external address signals given to the external address pins ex.Ai and ex.Aj are input to the address buffers 25.i and 25.j via the changeover switch 20. The input address signals are converted to an internal address signal. In accordance with this internal address signal, the row decoder 32 and column decoder 33 activate four contiguous memory cells MC.

Figure 9B:
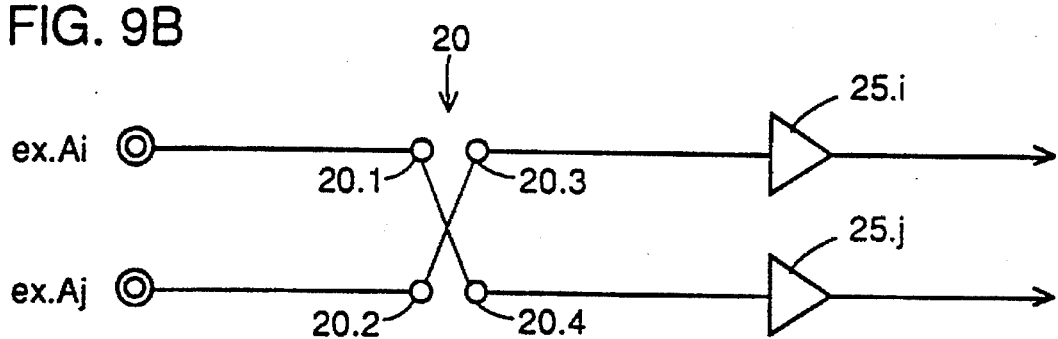

In the test mode, the switching signal $\phi x$ is brought Low and the switching signal $/\phi x$ High. In turn, the transfer gates 21 and 24 are shut down and the transfer gates 22 and 23 conduct. This connects the terminals 20.1 and 20.2 with the terminals 20.4 and 20.3, respectively, as indicated in FIG. 9B.

Figure 10:
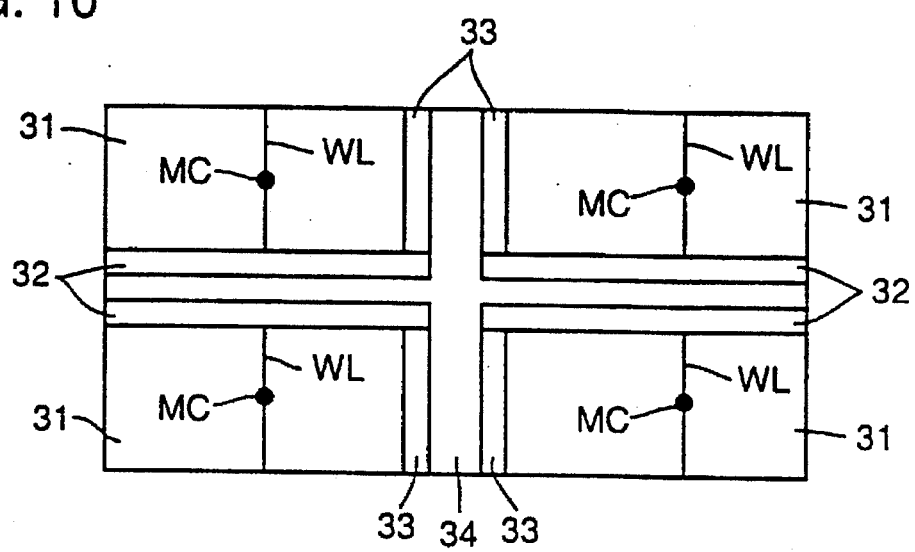
FIG. 10 is a plan view for explaining how the DRAM of FIG. 8 works.

At this point, the external address signals designating four contiguous memory cells MC are recombined into external address signals designating four memory cells each belonging to a different memory array 31, as shown in FIG. 10. The converted external address signals are again converted to an internal address signal by the address buffers 25.i and 25.j. In accordance with this internal address signal, the row decoder 32 and column decoder 33 activate four discrete memory cells MC each belonging to a different memory array 31.

With the second embodiment in the test mode, a plurality of discrete memory cells MC are tested in parallel. In that case, each of four memory cells MC under test belongs to a different memory array 31. This makes it possible to detect a cell fault caused by interference between any two contiguous memory cells MC.

The second embodiment involves having four memory arrays 31 driven concurrently. Thus it is possible to check for any faulty memory array driving circuit, defective row decoder or failed column decoder of these four memory arrays 31.

With the four memory arrays 31 driven at the same time, the power dissipation of the second embodiment increases along with electromagnetic noise. In this case, any fault caused by the electromagnetic noise may also be detected.

Figure 11:
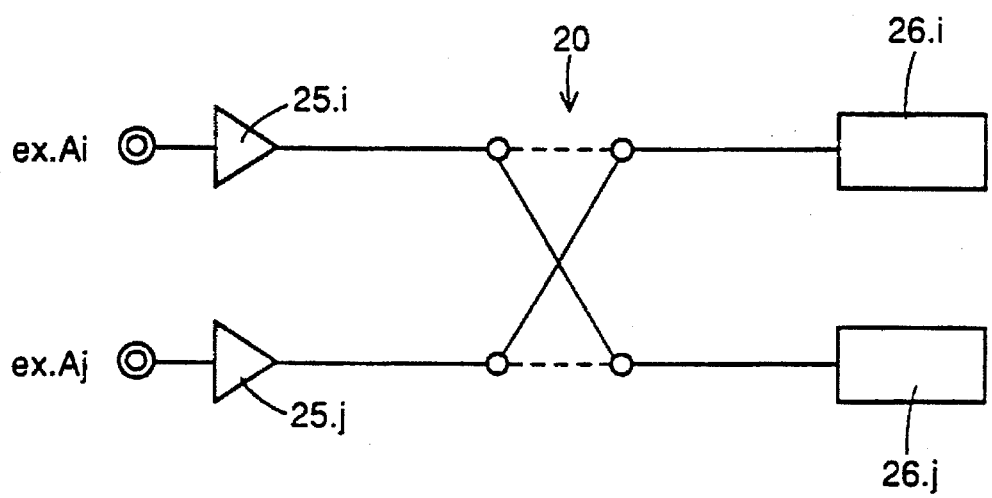
FIG. 11 is a circuit block diagram showing an improved version of the DRAM in FIG. 8.
Figure 12:
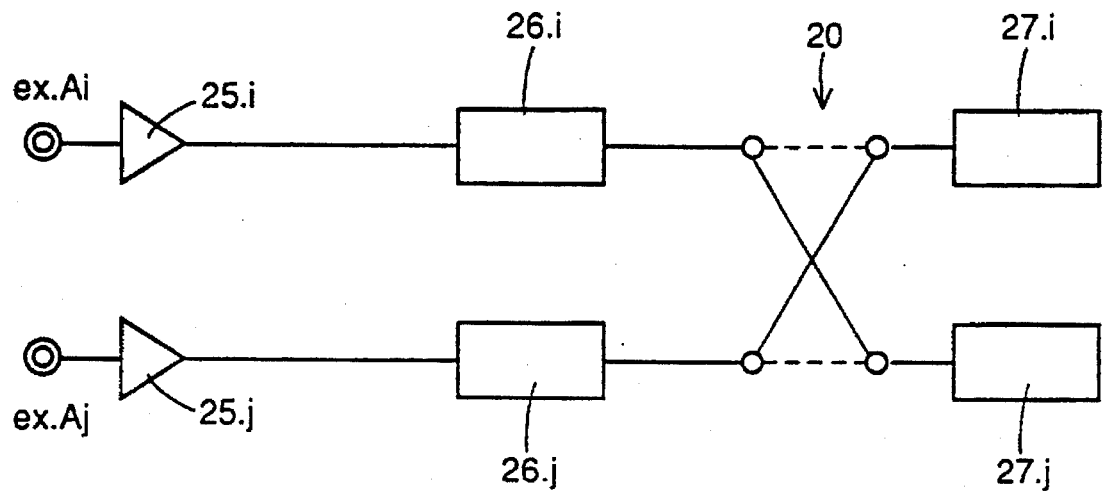
FIG. 12 is a circuit block diagram depicting another improved version of the DRAM in FIG. 8.

With the second embodiment, the changeover switch 20 is located interposingly between the external address pins ex.Ai and ex.Aj on the one hand, and the address buffers 25.i and 25.j on the other hand. Alternatively, the changeover switch 20 may be interposed between the address buffers 25.i and 25.j on the one hand, and predecoders 26.i and 26.j on the other hand, as shown in FIG. 11. Another alternative is to position the changeover switch 20 interposingly between the predecoders 26.i and 26.j on the one hand, and decoders 27.i and 27.j on the other hand, as depicted in FIG. 12.

Third Embodiment

Figure 13A:
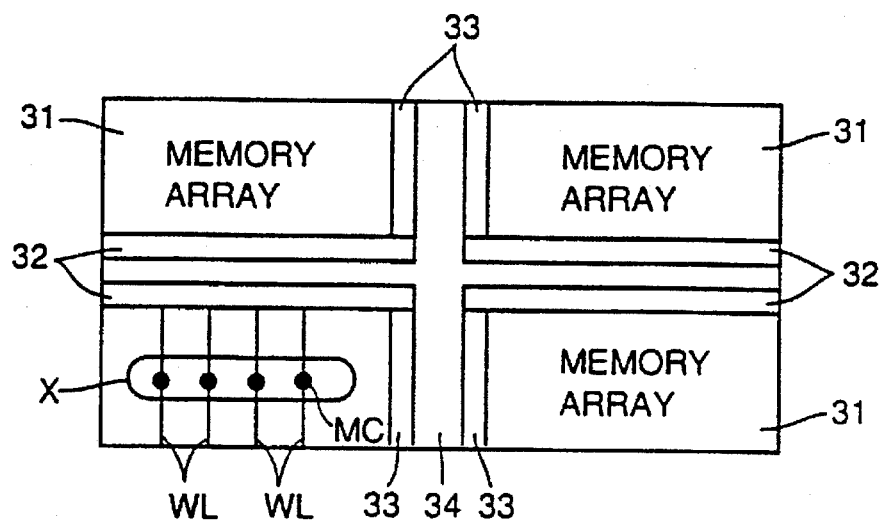
FIGS. 13A and 13B are plan views for explaining how a DRAM practiced as a third embodiment of the invention works.
Figure 13B:
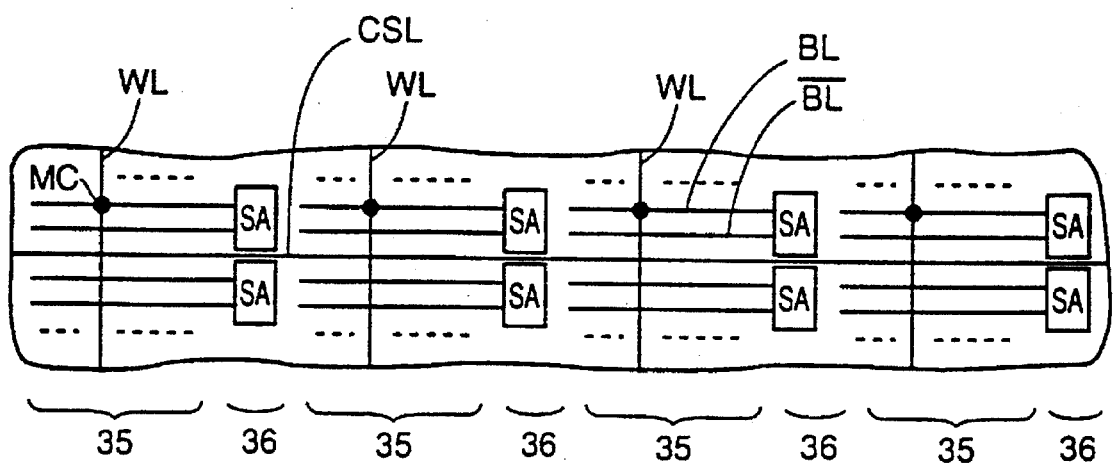

FIG. 13A is a plan view showing a typical chip layout of a DRAM practiced as the third embodiment of the invention. FIG. 13B is an enlarged view of the part X in FIG. 13A.

Referring to FIGS. 13A and 13B, what makes this DRAM different from the DRAM of the second embodiment is that in the test mode, the third embodiment activates four memory cells MC which are selected by the same column selection line CSL and which belong to a different subarray 35 each. The other aspects of the third embodiment constitution are the same as those of the second embodiment constitution and will not be discussed further.

With the third embodiment in the test mode, a plurality of memory cells MC are tested in parallel. In that case, each of four memory cells MC under test belongs to a different subarray 35. This makes it possible to detect a cell fault caused by interference between any two contiguous memory cells MC.

The third embodiment involves having four subarrays 35 driven concurrently. Thus it is possible to check for any defective word line WL of these four subarrays 35.

Fourth Embodiment

Figure 14A:
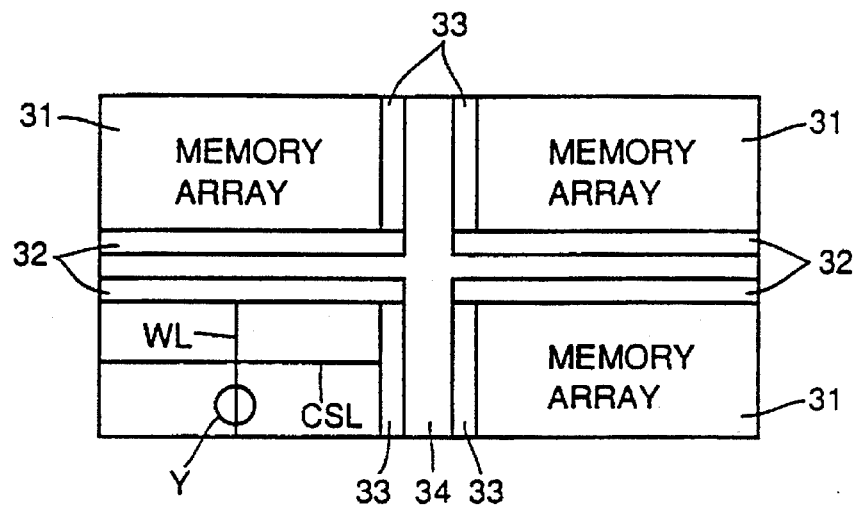
FIGS. 14A and 14B are plan views for explaining how a DRAM practiced as a fourth embodiment of the invention works.
Figure 14B:
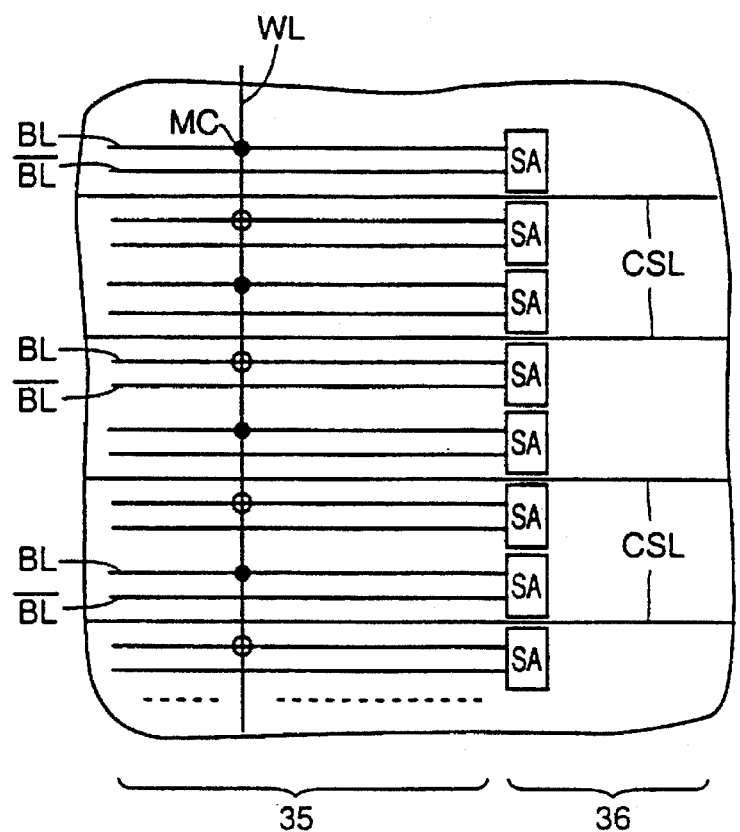

FIG. 14A is a plan view depicting a typical chip layout of a DRAM practiced as the fourth embodiment of the invention. FIG. 14B is an enlarged view of the part Y in FIG. 14A.

Referring to FIGS. 14A and 14B, what makes this DRAM different from the DRAM of the second embodiment is that in the test mode, the fourth embodiment activates four memory cells MC each of which is selected by the same word line WL and by a different column selection line CSL. The other aspects of the fourth embodiment constitution are the same as those of the second embodiment constitution and will not be discussed further.

With the fourth embodiment in the test mode, a plurality of memory cells MC are tested in parallel. In that case, each of four memory cells MC under test is selected by a different column selection line CSL. This makes it possible to detect a cell fault caused by interference between any two contiguous memory cells MC.

The fourth embodiment involves using four column selection lines CSL concurrently to select the relevant memory cells. Thus it is possible to check for any defective column selection line CSL.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory having a test mode, comprising:
   a memory array including a plurality of memory cells arranged in matrix fashion;
   selecting means for selecting two memory cells of said memory array in said test mode;
   writing means for generating a second signal by inverting an externally applied first signal, and for writing in parallel said first and second signals to the two memory cells selected by said selecting means;
   reading means for reading in parallel two signals from said two memory cells; and
   a test circuit for inverting either one of the two signals read by said reading means, and for determining that said two memory cells are normal when logic of the inverted signal coincides with logic of the other signal.

2. A semiconductor memory according to claim 1, wherein said writing means includes:
   a first signal generation circuit, furnished to correspond with each of said two memory cells, for receiving an externally supplied signal and for generating both an unmodified signal and an inverted signal of said externally supplied signal; and
   a first selection circuit for selectively supplying one of the unmodified signal and the inverted signal from said first signal generation circuit to the corresponding memory cell.

3. A semiconductor memory according to claim 2, wherein said test circuit includes:
   a signal processing circuit for acting, upon receipt of the two signals read by said reading means, to output unmodified the signal read from the memory cell to which said first signal was written, and to output inverted the signal read from the memory cell to which said second signal was written; and
   a logic circuit for outputting a signal indicating that said two memory cells are normal in case of a logical coincidence between the two signals output by said signal processing circuit.

4. A semiconductor memory according to claim 3, wherein said signal processing circuit includes:
   a second signal generation circuit, furnished to correspond with each of said two memory cells, for outputting both unmodified and inverted the signal read from the corresponding memory cell; and
   a second selection circuit for selectively supplying one of the unmodified and the inverted signal from said second signal generation circuit to said logic circuit.

5. A semiconductor memory according to claim 4, further comprising address terminals corresponding to said two memory cells;
   wherein said first selection circuit supplies the corresponding memory cell with one of the unmodified and the inverted signal from said first signal generation circuit depending on whether the corresponding address terminal is fed with a first or a second potential; and
   wherein said second selection circuit supplies said logic circuit with one of the unmodified and the inverted signal from said second signal generation circuit depending on whether the corresponding address terminal is fed with said first or said second potential.

6. A semiconductor memory having a test mode, comprising:
   a memory array including a plurality of memory cells arranged in matrix fashion;
   selecting means for selecting in said test mode, from said memory array a plurality of contiguously arranged memory cells;
   writing means for generating a second signal by inverting an externally applied first signal, and for writing a first and a second signal parallelly to said contiguously arranged memory cells selected by said selecting means so that, of every two memory cells of said contiguous memory cells, one will store said first signal and the other said second signal;
   reading means for reading parallelly a plurality of signals from said contiguously arranged memory cells; and
   a test circuit for inverting, of the plurality of signals read by said reading means, the signal read from the memory cell to which one of said first and second signals is written and for determining that the plurality of memory cells are normal when logic of the signal read from the memory cell to which the other signal has been written coincides with the logic of said inverted signal.

7. A semiconductor memory according to claim 6, wherein said writing means includes:
   a first signal generation circuit, furnished to correspond with each of said plurality of memory cells, for receiving an externally supplied signal and for generating both an unmodified signal and an inverted signal of said externally supplied signal; and
   a first selection circuit for selectively supplying one of the unmodified signal and the inverted signal from said first signal generation circuit to the corresponding memory cell.

8. A semiconductor memory according to claim 7, wherein said test circuit includes:

a signal processing circuit for acting, upon receipt of the signals read by said reading means, to output unmodified the signal read from the memory cell to which said first signal was written, and to output inverted the signal read from the memory cell to which said second signal was written; and a logic circuit for outputting a signal indicating that said contiguously arranged memory cells are normal in case of a logical coincidence between the signals output by said signal processing circuit.

9. A semiconductor memory according to claim 8, wherein said signal processing circuit includes:

a second signal generation circuit, furnished to correspond with each of said plurality of memory cells, for outputting both unmodified and inverted the signal read from the corresponding memory cell; and a second selection circuit for selectively supplying one of the unmodified and the inverted signal from said second signal generation circuit to said logic circuit.

10. A semiconductor memory according to claim 9, further comprising address terminals corresponding to said plurality of memory cells;

wherein said first selection circuit supplies the corresponding memory cell with one of the unmodified and the inverted signal from said first signal generation circuit depending on whether the corresponding address terminal is fed with a first or a second potential; and wherein said second selection circuit supplies said logic circuit with one of the unmodified and the inverted signal from said second signal generation circuit depending on whether the corresponding address terminal is fed with said first or said second potential.

* * * * *